United States Patent
Tsutsumi et al.

(10) Patent No.: US 11,059,973 B2
(45) Date of Patent: Jul. 13, 2021

(54) HEAT-CURABLE RESIN COMPOSITION AND SEMICONDUCTOR DEVICE

(71) Applicant: Shin-Etsu Chemical Co., Ltd., Tokyo (JP)

(72) Inventors: Yoshihiro Tsutsumi, Annaka (JP); Naoyuki Kushihara, Annaka (JP); Norifumi Kawamura, Annaka (JP); Yoshihira Hamamoto, Annaka (JP); Yuki Kudo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 34 days.

(21) Appl. No.: 16/523,040

(22) Filed: Jul. 26, 2019

(65) Prior Publication Data

US 2020/0048464 A1 Feb. 13, 2020

(30) Foreign Application Priority Data

Aug. 10, 2018 (JP) .............................. JP2018-151007

(51) Int. Cl.
| | | |
|---|---|---|
| *C08L 83/08* | (2006.01) | |
| *C08K 3/013* | (2018.01) | |
| *C08G 77/26* | (2006.01) | |
| *H01L 23/29* | (2006.01) | |

(52) U.S. Cl.
CPC .............. *C08L 83/08* (2013.01); *C08G 77/26* (2013.01); *C08K 3/013* (2018.01); *C08L 2203/20* (2013.01); *H01L 23/296* (2013.01)

(58) Field of Classification Search
CPC ....................................................... C08G 77/26
USPC .................................................... 528/26, 38
See application file for complete search history.

(56) References Cited

U.S. PATENT DOCUMENTS

| | | | | |
|---|---|---|---|---|
| 3,558,741 A | * | 1/1971 | Holub | .............. C07F 7/0838 |
| | | | | 525/102 |
| 4,522,985 A | * | 6/1985 | Ryang | .............. C08G 69/42 |
| | | | | 525/431 |
| 4,806,608 A | * | 2/1989 | Klemarczyk | .......... C07F 7/0838 |
| | | | | 526/262 |
| 5,122,436 A | * | 6/1992 | Tunney | ................. C08F 283/12 |
| | | | | 430/281.1 |
| 5,508,427 A | * | 4/1996 | Tagami | ................. C08G 77/045 |
| | | | | 548/406 |
| 7,405,244 B2 | * | 7/2008 | Yoneda | .................... C03C 17/30 |
| | | | | 428/209 |
| 9,482,950 B2 | * | 11/2016 | Kodama | ................ B82Y 40/00 |
| 2004/0048997 A1 | * | 3/2004 | Sugo | ..................... C08G 77/455 |
| | | | | 528/10 |
| 2006/0216520 A1 | | 9/2006 | Osada | |
| 2009/0062480 A1 | * | 3/2009 | Yoneda | ............. C08G 73/1057 |
| | | | | 525/417 |
| 2017/0355825 A1 | * | 12/2017 | Hattori | ...................... C09D 7/41 |
| 2018/0312723 A1 | * | 11/2018 | Hattori | ...................... C09J 4/06 |

FOREIGN PATENT DOCUMENTS

| | | |
|---|---|---|
| JP | 7-216054 A | 8/1995 |
| JP | 2003-138103 A | 5/2003 |
| JP | 2006-299246 A | 11/2006 |
| JP | 2018-24747 A | 2/2018 |
| JP | 2018-70781 A | 5/2018 |

OTHER PUBLICATIONS

Japanese Office Action, dated May 11, 2021, for Japanese Application No. 2018-151007, with an English translation.

* cited by examiner

*Primary Examiner* — Marc S Zimmer
(74) *Attorney, Agent, or Firm* — Birch, Stewart, Kolasch & Birch, LLP

(57) ABSTRACT

Provided are a resin composition capable of yielding a cured product exhibiting a superior heat resistance over a long period of time, and a superior reflow resistance due to a low water absorption rate even at a high temperature; and a semiconductor device encapsulated by such cured product. The resin composition is a heat-curable resin composition containing:

(A) an organopolysiloxane having, in one molecule, at least one cyclic imide group and at least one siloxane bond;
(B) an inorganic filler; and
(C) a radical polymerization initiator.

The semiconductor device is encapsulated by the cured product of such heat-curable resin composition.

7 Claims, No Drawings

HEAT-CURABLE RESIN COMPOSITION AND SEMICONDUCTOR DEVICE

BACKGROUND OF THE INVENTION

Field of the Invention

The present invention relates to a heat-curable resin composition; and a semiconductor device using the same.

Background Art

As an electronic part used in an electronic device, there is known a semiconductor package obtained by encapsulating a semiconductor element with a resin. Conventionally, such semiconductor package is usually manufactured via transfer molding of a tablet-shaped epoxy resin composition. Further, in recent years, as electronic devices have become smaller and lighter, electronic parts are now required to be mounted on wiring substrates in a highly dense manner, and even semiconductor packages are thus becoming smaller, thinner and lighter.

With these developments, the requirements for a semiconductor package material have become stricter than before. Especially, in the case of a semiconductor device employing surface mounting, as a result of exposing the semiconductor device to a high temperature at the time of performing solder reflow, peeling may occur in an interface between a semiconductor element(s) or a lead frame and a cured product of an epoxy resin composition as an encapsulation resin, and cracks may also occur in the semiconductor device, which may lead to failures significantly impairing the reliability of the semiconductor device.

As for these problems, there have been considered a method for reducing a stress occurring, at the time of performing reflow, in the interface between the semiconductor element(s) or lead frame and the cured product of the epoxy resin composition, by lowering the elasticity of the encapsulation resin; and a method for restricting the peeling in the interface by reducing the amount of water discharged as a result of lowering the water absorption rate of the encapsulation resin. Disclosed in JP-A-Hei-7-216054 is a resin composition comprising an epoxy resin containing a biphenyl-type epoxy resin; and a phenolic resin as a curing agent. However, such a kind of material often has a low crosslinking density, cannot easily exhibit a high glass-transition temperature (Tg), and may be inferior in a heat resistance such as a long-term heat resistance.

Meanwhile, an epoxy resin composition, particularly an epoxy resin composition comprising a non-biphenyl type epoxy resin and a phenolic curing agent can be turned into a cured product with a high Tg by increasing the crosslinking density of the composition. However, an excessively high crosslinking density tends to, in general, turn the cured product into a rigid structural body with a higher elastic modulus, and may lead to a higher water absorption rate as many hydroxyl groups will be formed.

In this way, epoxy resin compositions have a difficulty in achieving multiple properties at the same time. In order to solve these problems, there has been considered a combination of an epoxy resin and a maleimide compound. In JP-A-2003-138103 and JP-A-2006-299246, a high Tg and a high moisture resistance were achieved with a combination of an epoxy resin and a rigid maleimide compound. However, high elastic moduluses were observed at high temperatures, and a poor reflow resistance was observed as well. Meanwhile, in JP-A-2018-24747, although a high reflow resistance was achieved with a combination of an epoxy resin and a bismaleimide compound having an aliphatic hydrocarbon group(s) on its main chain, the decomposition of the aliphatic hydrocarbon groups on the main chain was significant during a long-term test. That is, further improvements are desired.

SUMMARY OF THE INVENTION

Thus, it is an object of the present invention to provide a resin composition capable of yielding a cured product exhibiting a superior heat resistance over a long period of time, and a superior reflow resistance due to a low water absorption rate even at a high temperature; and a semiconductor device encapsulated by such cured product.

The inventors of the present invention conducted a series of studies to solve the aforementioned problems, and completed the invention as follows. Specifically, the inventors found that the following heat-curable resin composition was capable of achieving the abovementioned objectives.

More specifically, the present invention is to provide the following heat-curable resin composition; a cured product thereof; and a semiconductor device encapsulated by such cured product.

[1]
A heat-curable resin composition comprising:
(A) an organopolysiloxane having, in one molecule, at least one cyclic imide group and at least one siloxane bond;
(B) an inorganic filler; and
(C) a radical polymerization initiator.

[2]
The heat-curable resin composition according to [1], wherein the component (A) is at least one selected from the following (A-1) and (A-2):
(A-1) a cyclic imide group-containing organopolysiloxane represented by the following average composition formula (1)

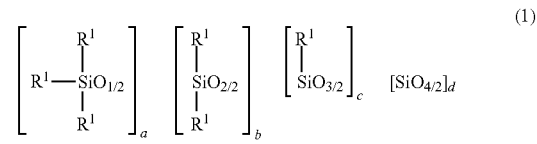

wherein $R^1$ independently represents a substituted or unsubstituted monovalent hydrocarbon group having 1 to 10 carbon atoms, or a group represented by the following general formula (2) or (3); at least one $R^1$ is a group represented by the following general formula (2) or (3); a represents an integer of not smaller than 2; b represents an integer of not smaller than 0; c represents an integer of not smaller than 0; d represents an integer of not smaller than 0; a, b, c and d satisfy $2 \le a+b+c+d \le 1{,}000$,

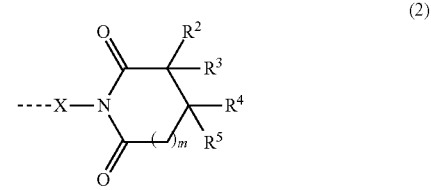

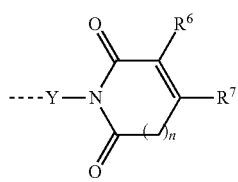

(3)

wherein each of R² to R⁷ independently represents a hydrogen atom or a substituted or unsubstituted monovalent hydrocarbon group having 1 to 10 carbon atoms; R³ and R⁴ may bond together to form a ring; R⁶ and R⁷ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to silicon atoms in the formula (1);

(A-2) a cyclic imide group-containing organopolysiloxane represented by the following average composition formula (1')

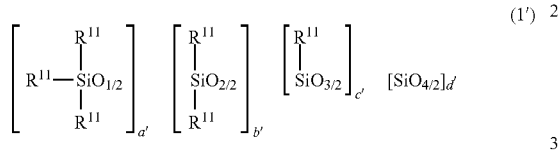

(1')

wherein $R^{11}$ independently represents a substituted or unsubstituted monovalent hydrocarbon group having 1 to 10 carbon atoms, or a group represented by the following general formula (2), (3) or (4); at least one $R^{11}$ is a group represented by the following general formula (2), (3) or (4); two $R^{11}$s may bond together to form the structure represented by the following general formula (4); a' represents an integer of not smaller than 2; b' represents an integer of not smaller than 0; c' represents an integer of not smaller than 0; d' represents an integer of not smaller than 0; a', b', c' and d' satisfy 2≤a'+b'+c'+d'≤1,000,

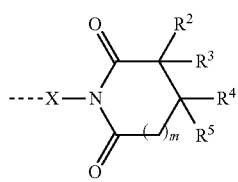

(2)

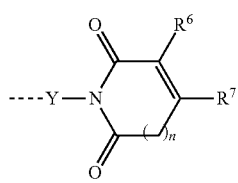

(3)

wherein each of R² to R⁷ independently represents a hydrogen atom or a substituted or unsubstituted monovalent hydrocarbon group having 1 to 10 carbon atoms; R³ and R⁴ may bond together to form a ring; R⁶ and R⁷ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to the silicon atoms in the formula (1'),

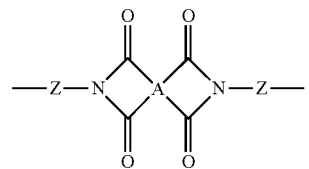

(4)

wherein A represents a tetravalent organic group having an aromatic or aliphatic ring; Z represents a substituted or unsubstituted divalent hydrocarbon group that has 1 to 10 carbon atoms, and may have a hetero group(s).

[3] The heat-curable resin composition according to [2], wherein A in the general formula (4) of the component (A) has any one of the following structures

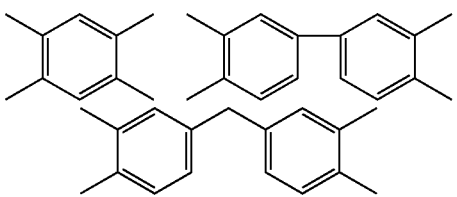

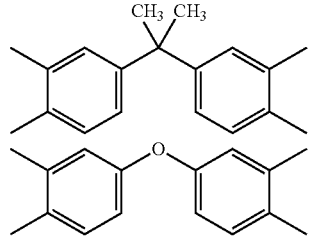

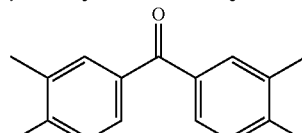

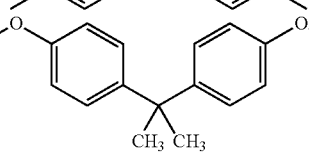

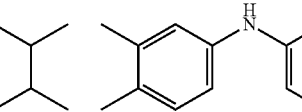

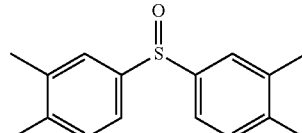

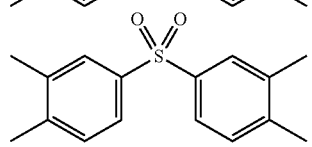

wherein bonds in the above structural formulae that are yet unbonded to substituent groups are to be bonded to carbonyl carbons forming cyclic imide structures in the general formula (4).

[4]
The heat-curable resin composition according to [2] or [3], wherein at least one of $R^1$s and/or $R^{11}$s is an organic group having a maleimide structure represented by the following formula (3')

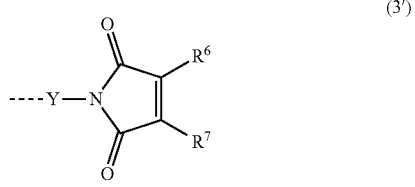

wherein each of $R^6$ and $R^7$ represents a hydrogen atom or a substituted or unsubstituted monovalent hydrocarbon group having 1 to 10 carbon atoms; $R^6$ and $R^7$ may bond together to form a ring; Y represents a substituted or unsubstituted divalent hydrocarbon group that has 1 to 10 carbon atoms, and may have a hetero atom(s); a broken line represents a connection to the silicon atoms in the formula (1) or (1').

[5]
A semiconductor device encapsulated by a cured product of the heat-curable resin composition according to any one of [1] to [4].

The cured product of the heat-curable resin composition of the present invention has a superior heat resistance over a long period of time, and a superior reflow resistance due to a low water absorption rate even at a high temperature. Thus, the heat-curable resin composition of the invention and the cured product thereof are useful for encapsulating semiconductors.

DETAILED DESCRIPTION OF THE INVENTION

The present invention is described in greater detail hereunder.
(A) Cyclic Imide Group-Containing Organopolysiloxane A component (A) used in the present invention is a cyclic imide group-containing organopolysiloxane. Particularly, the component (A) is an organopolysiloxane having, in one molecule, at least one cyclic imide group and at least one siloxane bond (Si—O bond).

It is preferred that the component (A) be at least one selected from the following (A-1) and (A-2).
(A-1) Cyclic Imide Group-Containing Organopolysiloxane Represented by the Following Average Composition Formula (1)

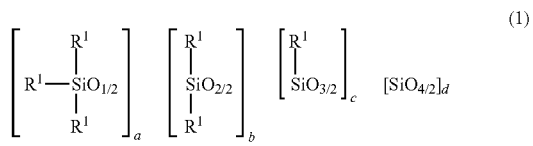

In the above formula, each $R^1$ independently represents a substituted or unsubstituted monovalent hydrocarbon group having 1 to 10 carbon atoms; or a group represented by the following general formula (2) or (3). At least one $R^1$ is the group represented by the following general formula (2) or (3). a represents an integer of not smaller than 2, b represents an integer of not smaller than 0, c represents an integer of not smaller than 0, d represents an integer of not smaller than 0, provided that $2 \leq a+b+c+d \leq 1,000$.

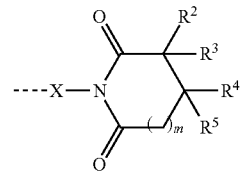

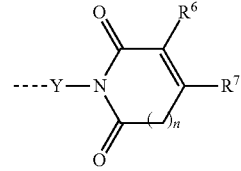

In the above formulae, each of $R^2$ to $R^7$ independently represents a hydrogen atom or a substituted or unsubstituted monovalent hydrocarbon group having 1 to 10 carbon atoms. $R^3$ and $R^4$ may bond together to form a ring. $R^6$ and $R^7$ may bond together to form a ring. Each of m and n represents an integer of 0 to 3. Each of X and Y represents a substituted or unsubstituted divalent hydrocarbon group that has 1 to 10 carbon atoms, and may have a hetero atom(s). Broken lines represent connections to the silicon atoms in the formula (1).

(A-2) Cyclic Imide Group-Containing Organopolysiloxane Represented by the Following Average Composition Formula (1')

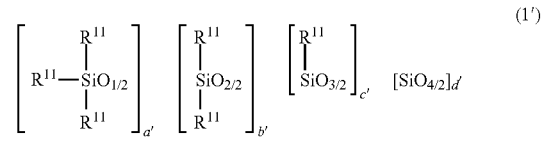

In the above formula, each $R^{11}$ independently represents a substituted or unsubstituted monovalent hydrocarbon group having 1 to 10 carbon atoms; or a group represented by the following general formula (2), (3) or (4). At least one $R^{11}$ is the group represented by the following general formula (2), (3) or (4). Two $R^{11}$s may bond together to form the structure represented by the following general formula (4). a' represents an integer of not smaller than 2, b' represents an integer of not smaller than 0, c' represents an integer of not smaller than 0, and d' represents an integer of not smaller than 0, provided that $2 \leq a'+b'+c'+d' \leq 1,000$.

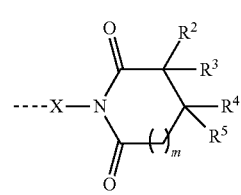

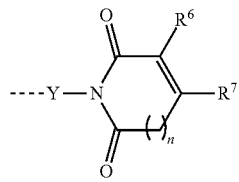

(3)

In the above formulae, each of $R^2$ to $R^7$ independently represents a hydrogen atom or a substituted or unsubstituted monovalent hydrocarbon group having 1 to 10 carbon atoms. $R^3$ and $R^4$ may bond together to form a ring. $R^6$ and $R^7$ may bond together to form a ring. Each of m and n represents an integer of 0 to 3. Each of X and Y represents a substituted or unsubstituted divalent hydrocarbon group that has 1 to 10 carbon atoms, and may have a hetero atom(s). Broken lines represent connections to the silicon atoms in the formula (1').

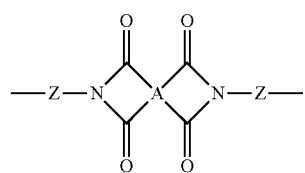

(4)

In the general formula (4), A represents a tetravalent organic group having an aromatic ring or aliphatic ring. Z represents a substituted or unsubstituted divalent hydrocarbon group that has 1 to 10 carbon atoms, and may have a hetero group(s).

With such cyclic imide group-containing organopolysiloxane as the component (A), not only a polymer with a high heat resistance can be formed by allowing the cyclic imide groups to react, but a cured product of the composition tends to exhibit an even lower elasticity as the main backbone of such organopolysiloxane has polysiloxane. In addition, a high heat resistance can be imparted as well due to the strengths of the bonding forces of the siloxane bonds (Si—O bonds). Further, since a polysiloxane backbone is present, not only a low water absorption rate can be achieved, but a high moisture discharge rate can be achieved as well. Thus, the composition of the present invention consequently has a high reflow resistance.

In the formula (1) of the component (A-1), each $R^1$ independently represents a substituted or unsubstituted monovalent hydrocarbon group having 1 to 10 carbon atoms; or the group represented by the above general formula (2) or (3). At least one $R^1$ is the group represented by the above general formula (2) or (3). Examples of the substituted or unsubstituted monovalent hydrocarbon group having 1 to 10 carbon atoms include alkyl groups such as a methyl group, an ethyl group, a propyl group and a butyl group; cycloalkyl groups such as a cyclohexyl group; and aryl groups such as a phenyl group. Further examples of such hydrocarbon group may include groups obtained by substituting a part of or all the carbon atom-bonded hydrogen atoms in any of the above groups with halogen atoms or other groups. As a substituent group, there may be used, for example, a trifluoromethyl group and 3,3,3-trifluoropropyl group. Here, an unsubstituted monovalent hydrocarbon group having 1 to 10 carbon atoms is preferred; a saturated aliphatic hydrocarbon group having 1 to 6 carbon atoms or an aromatic hydrocarbon group having 6 to 10 carbon atoms is more preferred; and a methyl group or a phenyl group is even more preferred.

As for $R^1$, at least one, preferably 2 to 200, more preferably 2 to 150 of them is/are the group(s) represented by the general formula (2) or (3).

In the above formulae (2) and (3), each of $R^2$ to $R^7$ independently represents a hydrogen atom or a substituted or unsubstituted monovalent hydrocarbon group having 1 to 10 carbon atoms. Examples of the monovalent hydrocarbon group include alkyl groups such as a methyl group, an ethyl group, a propyl group and a butyl group; cycloalkyl groups such as a cyclohexyl group; and aryl groups such as a phenyl group. Further examples of such hydrocarbon group may include groups obtained by substituting a part of or all the carbon atom-bonded hydrogen atoms in any of the above groups with halogen atoms or other groups. As a substituent group, there may be used, for example, a trifluoromethyl group and 3,3,3-trifluoropropyl group. As each of $R^2$ to $R^7$, preferred are a hydrogen atom and a methyl group. In addition, $R^3$ and $R^4$ may bond together to form a ring; $R^6$ and $R^7$ may bond together to form a ring. Examples of such ring include a cyclopropane ring, a cyclobutane ring, a cyclopentane ring, a cyclohexane ring and a benzene ring, among which a benzene ring is preferred.

Each of m and n represents an integer of 0 to 3, preferably an integer of 0 to 2, more preferably 0 or 1. Further, in the formula (1) of the component (A-1), it is more preferred that at least one $R^1$ be a group represented by the following formula (3') (formula (3') being established when n=0 in the above formula (3)). In the general formula (3'), $R^6$, $R^7$ and Y are defined as above.

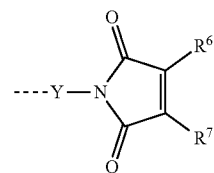

(3')

In the formulae (2), (3) and (3'), each of X and Y represents a substituted or unsubstituted divalent hydrocarbon group that has 1 to 10 carbon atoms, and may have a hetero atom(s), examples of which include alkylene groups such as $CH_2$, $C_2H_4$, $C_3H_6$, $C_4H_8$, $C_5H_{10}$ and $C_6H_{12}$; and the divalent hydrocarbon group may also have, for example, an ether group(s) or thioether group(s). Further, there may also be formed a cyclic structure such as that of a phenylene group or a cyclohexylene group, and a part of or all the carbon atom-bonded hydrogen atoms may be substituted by halogen atoms or other groups.

In the above formula (1), a represents an integer of not smaller than 2, preferably an integer of 2 to 12. b represents an integer of not smaller than 0, preferably an integer of 0 to 998, more preferably an integer of 0 to 100. c represents an integer of not smaller than 0, preferably an integer of 0 to 10. d represents an integer of not smaller than 0, preferably an integer of 0 to 5. a, b, c and d satisfy $2 \leq a+b+c+d \leq 1,000$, preferably $2 \leq a+b+c+d \leq 100$. When a+b+c+d is greater than 1,000, workability may be impaired.

In the formula (1') of the component (A-2), $R^{11}$ independently represents a substituted or unsubstituted monovalent hydrocarbon group having 1 to 10 carbon atoms; or the group represented by the general formula (2), (3) or (4). At least one $R^{11}$ is the group represented by the general formula (2), (3) or (4). Two $R^{11}$s may bond together to form a structure represented by the general formula (4). Here, among the groups represented by $R^{11}$, preferable examples of the monovalent hydrocarbon group or the group represented by the formula (2) or (3) may include those listed in the case of $R^1$ in the component (A-1).

Z in the formula (4) represents a substituted or unsubstituted divalent hydrocarbon group that has 1 to 10 carbon atoms, and may have a hetero group(s), the divalent hydrocarbon group being derived from a diamine compound as a raw material for synthesizing the component (A). Examples of the diamine compound include aliphatic diamines such as tetramethylenediamine, 1,4-diaminocyclohexane and 4,4'-diaminodicyclohexylmethane; and aromatic diamines such as phenylenediamine, 4,4'-diaminodiphenylether and 2,2-bis(4-aminophenyl)propane. Two or more of them may be used in combination.

A in the formula (4) represents a tetravalent organic group having an aromatic or aliphatic ring. Here, it is preferred that A have any one of the following structures in terms of ease in synthesizing and availability.

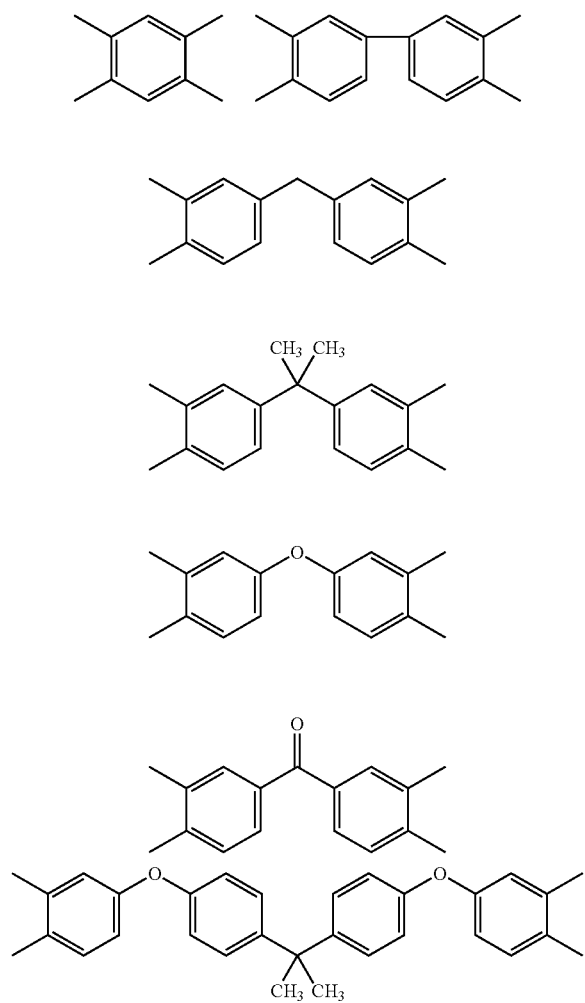

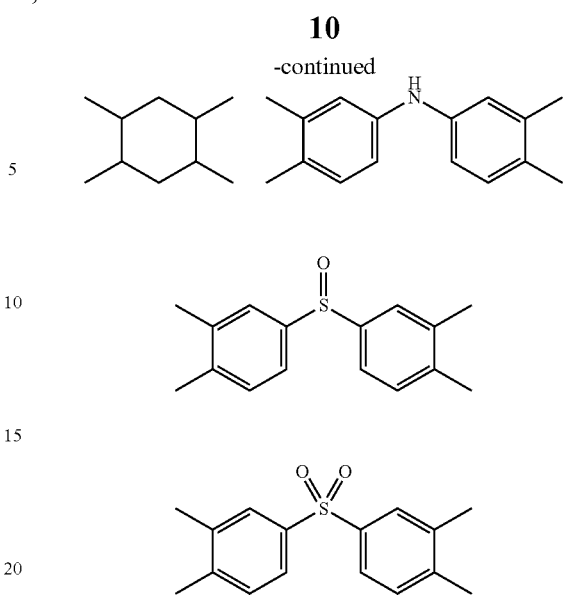

In the above formula (1'), a' represents an integer of not smaller than 2, preferably an integer of 2 to 12; b' represents an integer of not smaller than 0, preferably an integer of 0 to 998, more preferably an integer of 0 to 100; c' represents an integer of not smaller than 0, preferably an integer of 0 to 10; and d' represents an integer of not smaller than 0, preferably an integer of 0 to 5. Here, a', b', c' and d' satisfy $2 \leq a'+b'+c'+d' \leq 1{,}000$, preferably $2 \leq a'+b'+c'+d' \leq 100$. When $a'+b'+c'+d'$ is greater than 1,000, workability may be impaired.

As for the property of the component (A) at room temperature, it may be either solid or liquid. However, it is preferred that the component (A) be solid in terms of a molding method of the composition of the present invention. Here, there may be used one or multiple kinds of the organopolysiloxane as the component (A).

It is preferred that the component (A) be contained in the composition of the invention, by an amount of 8 to 60% by mass, more preferably 10 to 55% by mass, even more preferably 12 to 50% by mass.

In addition to the cyclic imide group-containing organopolysiloxane as the component (A), a maleimide compound having no siloxane bond may be used together. For example, there may be used maleimide compounds represented by the following formulae (5) and (7).

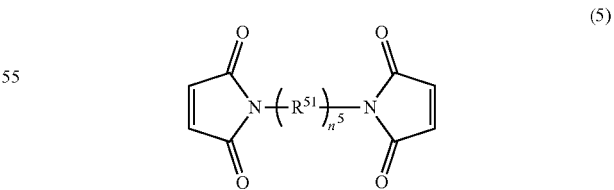

(5)

In the above formula (5), $n^5$ represents a number of 1 to 50. $R^{51}$ represents one or more kinds of divalent groups selected from a linear or branched alkylene group having 1 to 40 carbon atoms; a divalent cyclic hydrocarbon group that has 3 to 20 carbon atoms and may have a hetero atom(s); —O—; —NH—; —S—; and —$SO_2$—.

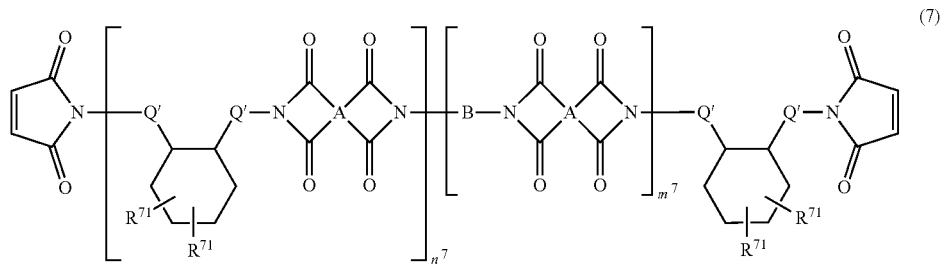

(7)

In the above formula (7), A is defined as above; B represents an alkylene chain having 6 to 18 carbon atoms and a divalent aliphatic ring that may contain a hetero atom. Q' represents a linear alkylene group having 6 or more carbon atoms. $R^{71}$ independently represents a linear or branched alkyl group having 6 or more carbon atoms. $n^7$ represents a number of 1 to 10. $m^7$ represents a number of 0 to 10.

As a method for synthesizing the cyclic imide group-containing organopolysiloxane as the component (A), a (poly)amino group-modified organopolysiloxane having the corresponding backbone (e.g. 1,3-di(3-aminopropyl)-1,1,3,3-tetramethyldisiloxane; a reaction mixture of 1,3-di(3-aminopropyl)-1,1,3,3-tetramethyldisiloxane and 4,4'-oxydiphthalic anhydride) and an acid anhydride compound (e.g. maleic anhydride) are at first reacted under the presence of an acid catalyst. After a (poly)amic acid is formed, the acid amide in the (poly)amic acid is then subjected to a dehydration cyclization reaction in a solvent such as toluene.

When using together a cyclic imide group-containing organopolysiloxane and a maleimide compound having no siloxane bond, it is preferred that the component (A) be added in an amount at which a ratio between such cyclic imide group-containing organopolysiloxane and maleimide compound having no siloxane bond is in a range of cyclic imide group-containing organopolysiloxane:maleimide compound having no siloxane bond=100:0 to 25:75 (mass ratio), more preferably 100:0 to 30:70 (mass ratio).

(B) Inorganic Filler

An inorganic filler as a component (B) is added to improve the strength of a cured product of the heat-curable resin composition of the present invention. As the inorganic filler as the component (B), there may be used those that are normally added to an epoxy resin composition or a silicone resin composition. For example, there may be used silicas such as a spherical silica, a molten silica and a crystalline silica; alumina; silicon nitride; aluminum nitride; boron nitride; a glass fiber; and a glass particle(s).

While there are no particular restrictions on the average particle size and shape of the inorganic filler as the component (B), it is preferred that the average particle size thereof be 3 to 40 μm. As the component (B), preferred is a spherical silica having an average particle size of 0.5 to 40 μm. Here, an average particle size refers to a value obtained as a mass average value $D_{50}$ (or median diameter) in a particle size distribution measurement that is carried out by a laser diffraction method.

Further, from the perspective of achieving a higher fluidity of the composition obtained, inorganic fillers with particle sizes from multiple ranges may be used in combination. In such case, it is preferred that there be combined spherical silicas with particle sizes belonging to a microscopic range of 0.1 to 3 μm, an intermediate range of 3 to 7 μm, and a coarse range of 10 to 40 μm. In order to achieve an even higher fluidity, it is preferred that there be used a spherical silica with an even larger average particle size.

It is preferred that the inorganic filler as the component (B) be employed in an amount of 300 to 1,000 parts by mass, particularly preferably 400 to 800 parts by mass, per a sum total of 100 parts by mass of heat-curable resin component such as the component (A). When such amount is smaller than 300 parts by mass, there exists a concern that a sufficient strength may not be achieved. When such amount is greater than 1,000 parts by mass, unfilling defects due to an increase in viscosity may occur, and a flexibility may be lost, which may then cause failures such as peeling in an element(s). Here, it is preferred that this inorganic filler be contained in an amount of 10 to 90% by mass, particularly preferably 20 to 85% by mass, with respect to the whole composition.

(C) Radical Polymerization Initiator

A radical polymerization initiator as a component (C) is added to the heat-curable resin composition of the present invention. This radical polymerization initiator is added to improve the reactivity of the cyclic imide groups in the component (A), and there are no particular restrictions on the type(s) of such radical polymerization initiator.

There are no particular restrictions on the radical polymerization initiator for promoting the reaction of the component (A). However, a thermal radical polymerization initiator is preferred in terms of performing molding by heat. Here, there are also no restrictions on the type(s) of such thermal radical polymerization initiator. Specific examples of such thermal radical polymerization initiator include dicumylperoxide, t-hexylhydroperoxide, 2,5-dimethyl-2,5-bis(t-butylperoxy)hexane, α,α'-bis(t-butylperoxy)diisopropylbenzene, t-butylcumyl peroxide and di-t-butylperoxide. The usage of a photo-radical polymerization initiator is not particularly preferable in terms of handling property and storability.

Regardless of the type(s) of these radical polymerization initiators, one kind of them may be used singularly, or two or more kinds thereof may be used in combination. The radical polymerization initiator(s) is added in an amount of 0.1 to 10 parts by mass, preferably 0.2 to 5 parts by mass, per 100 parts by mass of the component (A).

In addition to the above components, any of the following optional component(s) may be optionally added to the invention.

(D) Mold Release Agent

A mold release agent can be added to the heat-curable resin composition of the present invention. The mold release agent as a component (D) is added to improve a mold releasability at the time of performing molding. There are no restrictions on such mold release agent, as long as the mold release agent employed is that used in a general heat-curable epoxy resin composition. While examples of the mold release agent include a natural wax (e.g. carnauba wax and rice wax) and a synthetic wax (e.g. acid wax, polyethylene wax and fatty acid ester), carnauba wax is preferred in terms of the mold releasability of the cured product.

It is preferred that the component (D) be added in an amount of 0.05 to 5.0% by mass, particularly preferably 1.0 to 3.0% by mass, with respect to the sum total of the heat-curable resin component. When such amount of the component (D) added is smaller than 0.05% by mass, the cured product of the composition of the invention may not exhibit a sufficient mold releasability. When the amount of the component (D) added is greater than 5.0% by mass, the composition of the invention may bleed out, and the cured product of the composition may exhibit an adhesion failure, for example.

In this specification, the heat-curable resin component refers to the component (A); if the component (D) is added as an optional component, the component (D) shall also be regarded as a heat-curable resin component.

(E) Coupling Agent

A coupling agent such as a silane coupling agent and a titanate coupling agent can be added to the heat-curable resin composition of the present invention, for the purpose of, for example, improving a bonding strength between the heat-curable resin component; and the inorganic filler as the component (B), and improving an adhesiveness between such resin component and a metal lead frame or substrate.

Examples of such coupling agent include an epoxy functional alkoxysilane (e.g. 3-glycidoxypropyltrimethoxysilane, 3-glycidoxypropylmethyldiethoxysilane and β-(3,4-epoxycyclohexyl)ethyltrimethoxysilane), a mercapto functional alkoxysilane (e.g. γ-mercaptopropyltrimethoxysilane) and an amine functional alkoxysilane (e.g. γ-aminopropyltrimethoxysilane and N-2-(aminoethyl)-3-aminopropyltrimethoxysilane).

There are no particular restrictions on the amount of the coupling agent added and a surface treatment method thereof. Such amount and surface treatment method may be derived from a common procedure(s).

Further, the inorganic filler may be treated with the coupling agent in advance; or the composition may be produced while performing surface treatment by adding the coupling agent at the time of kneading the heat-curable resin component together with the inorganic filler.

It is preferred that the component (E) be contained in an amount of 0.1 to 8.0% by mass, particularly preferably 0.5 to 6.0% by mass, per the sum total of the heat-curable resin component. When such amount of the component (E) is smaller than 0.1% by mass, an insufficient adhesion effect to a base material may be observed. When the amount of the component (E) is greater than 8.0% by mass, a viscosity may extremely decrease such that voids may occur.

Other Additives

If necessary, various types of additives may further be added to the heat-curable resin composition of the invention which is used for a semiconductor, in addition to the components (A) to (C) as essential components. The additive(s) added may, for example, be a flame retardant, an organopolysiloxane, a silicone oil, a thermalplastic resin, a thermalplastic elastomer, an organic synthetic rubber, a light stabilizer, a pigment and/or a dye; and an ion-trapping agent, for example, may also be added for improving electric properties. Also, a fluorine-containing material such as a fluorine-coated filler may, for example, be further added for the purpose of improving a dielectric property.

There are no particular restrictions on a method for producing the composition of the present invention. For example, the components (A) to (C) and other components, if necessary, are to be blended together at given compounding ratios. Next, a mixer or the like is used to thoroughly and uniformly mix these components, followed by melting and mixing them with, for example, a heat roller, a kneader or an extruder. A product thus obtained may then be cooled to be solidified, and later crushed into pieces of an appropriate size. The resin composition thus obtained can be used as a molding material.

As the most general method for molding the resin composition, there can be listed a transfer molding method and a compression molding method. In a transfer molding method, a transfer molding machine is used to perform molding under a molding pressure of 5 to 20 N/mm$^2$ and at a molding temperature of 120 to 190° C. for a molding period of 30 to 500 sec, preferably at a molding temperature of 150 to 185° C. for a molding period of 30 to 300 sec. Further, in a compression molding method, a compression molding machine is used to perform molding at a molding temperature of 120 to 190° C. for a molding period of 30 to 900 sec, preferably at a molding temperature of 130 to 160° C. for a molding period of 120 to 600 sec. Moreover, in each molding method, post curing may further be performed at 150 to 225° C. for 0.5 to 20 hours.

If produced by the above method, the cured product of the heat-curable resin composition of the invention shall exhibit a superior heat resistance over a long period of time, and a superior reflow resistance due to a low water absorption rate even at a high temperature. The heat-curable resin composition of the invention is suitable for encapsulating, for example, semiconductors and various types of in-car modules.

WORKING EXAMPLE

The present invention is described in detail hereunder with reference to working and comparative examples. However, the invention is not limited to the working examples below.

(A) Cyclic Imide Group-Containing Organopolysiloxane (A-1) Maleimide group-containing organopolysiloxane-1 represented by the following formula

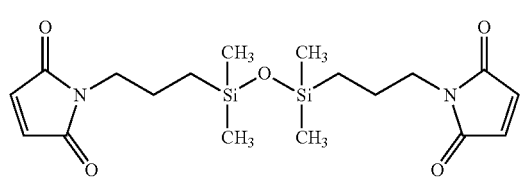 [SMILES: C[Si](C)(CCCN1C(=O)C=CC1=O)O[Si](C)(C)CCCN1C(=O)C=CC1=O]

(A-2) Maleimide group-containing organopolysiloxane-2 represented by the following formula

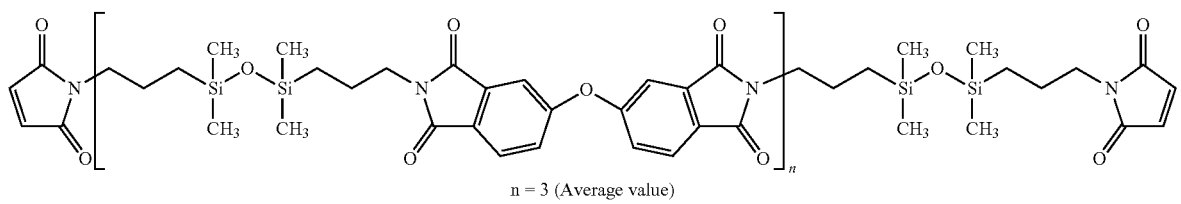

n = 3 (Average value)

(A-3) Other maleimide compounds
(A-3-1) Maleimide compound represented by the following formula (BMI-3000 by Designer Molecules Inc.)

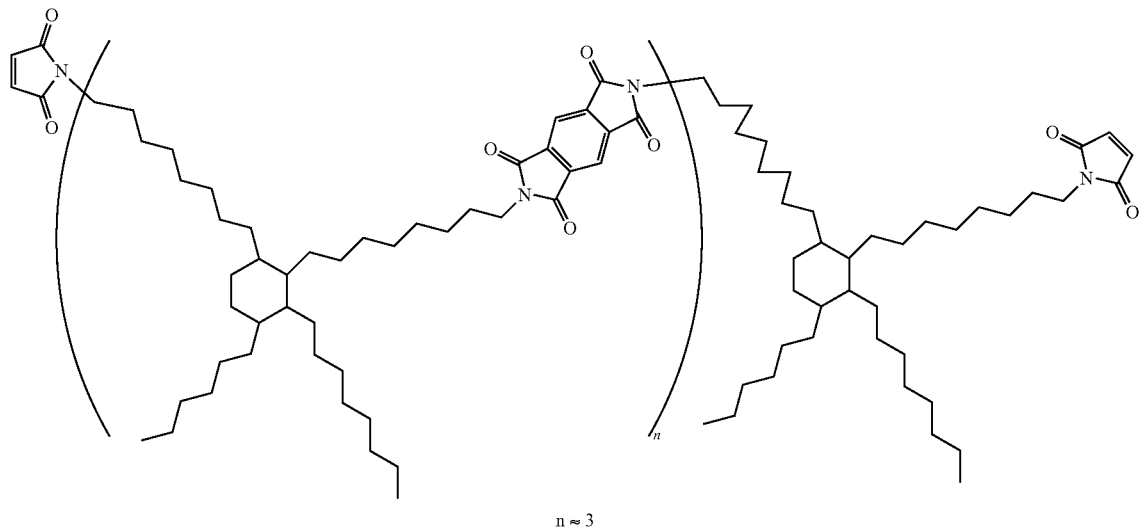

n ≈ 3

(A-3-2) 4,4'-diphenylmethanebismaleimide (BMI-1000 by Daiwa Fine Chemicals Co., Ltd.)
(B) Inorganic Filler
(B-1) Molten spherical silica (RS-8225H/53C by TATSUMORI LTD.; average particle size 12 μm)
(C) Radical Polymerization Initiator
(C-1) Dicumylperoxide (PERCUMYL D by NOF CORPORATION)
(D) Mold Release Agent
(D-1) Carnauba wax (TOWAX-131 by TOA KASEI CO., LTD.)
(E) Coupling Agent
(E-1) 3-glycidoxypropyltrimethoxysilane (KBM-403 by Shin-Etsu Chemical Co., Ltd.)

Working Examples 1 to 6; Comparative Examples 1 and 2

Heat-curable epoxy resin compositions were obtained by melting and mixing the components at the compounding ratios (parts by mass) shown in Table 1, and then performing cooling and crushing. The following properties of each composition were measured. The results thereof are shown in Table 1.

Elastic Modulus Under Heat

A mold manufactured in accordance with JIS K 6911:2006 was used to produce a cured product of the above resin composition under a condition(s) of: molding temperature 175° C.; molding pressure 6.9 N/mm$^2$; molding period 180 sec. The cured product was then subjected to post curing at 200° C. for an hour.

A bending elastic modulus of a test piece prepared from the post-cured cured product was then measured at 260° C. in accordance with JIS K6911:2006.

Water Absorption Rate, Residual Water Absorption Rate (Moisture Discharge Rate)

A circular plate having a thickness of 3 mm and a diameter of 50 mm was molded under a condition(s) of: molding temperature 175° C.; molding pressure 6.9 N/mm$^2$; molding period 180 sec. The cured product was then subjected to post curing at 200° C. for an hour. After further treating the cured product under a saturated water vapor of 121° C. and 2.1 atm for 24 hours, a weight increase rate was calculated based on weights observed before and after the treatment, and a water absorption rate was then able to be calculated based on such weight increase rate. Later, the cured product that had absorbed water was subjected to a heat treatment at 120° C. for 24 hours. A residual water absorption rate was then calculated based on a weight observed immediately after the post curing, and on a weight observed after the cured product had absorbed water and been further subjected to the heat treatment.

Weight Reduction Rate

A circular plate having a thickness of 3 mm and a diameter of 50 mm was molded under a condition(s) of: molding temperature 175° C.; molding pressure 6.9 N/mm$^2$; molding period 180 sec. The cured product was then subjected to post curing at 200° C. for an hour. After further performing a heat treatment on such cured product at 250° C. for 48 hours, a weight reduction rate was then calculated based on weights observed before and after the heat treatment.

Reflow Resistance

A QFP (Quad Flat Package) (14 mm×20 mm×1.4 mm, 6 cavities) was molded under a condition(s) of: molding temperature 175° C.; molding pressure 6.9 N/mm$^2$; molding period 180 sec. This sample was then subjected to post curing at 200° C. for an hour. Later, there were prepared six samples by performing separation at lead parts. Each sample was dried at 125° C. for two hours, and then rendered to absorb water at 85° C./85% RH for 48 hours. Next, the sample was passed through an IR reflow furnace three times (maximum temperature 260° C., in-furnace transit time 10 sec), followed by using an ultrasonic flaw detector to observe whether peeling had occurred in the package. The number of the samples exhibiting peeling was then counted.

As shown in Table 1, it became clear that the cured product of the composition of the present invention exhibited a small reduction in weight even when exposed to a high temperature for a long period of time i.e. the cured product had a favorable heat resistance; it also became clear that the cured product was superior in reflow resistance as the elastic modulus thereof under heat was low, and a low water absorption rate and an immediate moisture discharge property were observed.

TABLE 1

| Composition Table (part by mass) | | | Working example 1 | 2 | 3 | 4 | 5 | 6 | Comparative example 1 | 2 |
|---|---|---|---|---|---|---|---|---|---|---|
| (A) | Cyclic imide group-containing organopolysiloxane | A-1 | 100.0 | | 50.0 | 50.0 | 30.0 | 25.0 | | |
| | | A-2 | | 100.0 | 50.0 | | | | | |
| | | A-3-1 | | | | 50.0 | 70.0 | 75.0 | 100.0 | |
| | | A-3-2 | | | | | | | | 100.0 |
| (B) | Inorganic filler | B-1 | 450.0 | 450.0 | 450.0 | 450.0 | 450.0 | 450.0 | 450.0 | 450.0 |
| (C) | Radical polymerization initiator | C-1 | 2.0 | 2.0 | 2.0 | 2.0 | 2.0 | 2.0 | 2.0 | 2.0 |
| (D) | Mold release agent | D-1 | 2.0 | 2.0 | 2.0 | 2.0 | 2.0 | 2.0 | 2.0 | 2.0 |
| (E) | Coupling agent | E-1 | 1.5 | 1.5 | 1.5 | 1.5 | 1.5 | 1.5 | 1.5 | 1.5 |
| Evaluation results | Elastic modulus under heat | GPa | 0.3 | 0.5 | 0.4 | 0.3 | 0.4 | 0.3 | 0.3 | 1.9 |
| | Water absorption rate | % | 0.25 | 0.22 | 0.22 | 0.29 | 0.27 | 0.27 | 0.34 | 0.39 |
| | Residual water absorption rate | % | 0.05 | 0.03 | 0.04 | 0.08 | 0.06 | 0.07 | 0.16 | 0.12 |
| | Weight reduction rate | % | 0.4 | 0.3 | 0.3 | 0.4 | 0.7 | 1.0 | 2.5 | 1.5 |
| | Reflow resistance | | 0/6 | 0/6 | 0/6 | 1/6 | 0/6 | 1/6 | 2/6 | 6/6 |

What is claimed is:

1. A heat-curable resin composition comprising:

(A) an organopolysiloxane having, in one molecule, at least one cyclic imide group and at least one siloxane bond;

(B) an inorganic filler; and (C) a radical polymerization initiator;

wherein the component (A) comprises at least (A-2) or comprises (A-2) and (A-1):

(A-1) a cyclic imide group-containing organopolysiloxane represented by the following average composition formula (1)

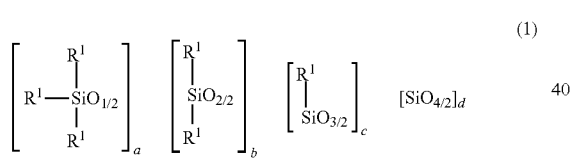

(1)

wherein $R^1$ independently represents a substituted or unsubstituted monovalent hydrocarbon group having 1 to 10 carbon atoms, or a group represented by the following general formula (2) or (3); at least one $R^1$ is a group represented by the following general formula (2) or (3); a represents an integer of not smaller than 2; b represents an integer of not smaller than 0; c represents an integer of not smaller than 0; d represents an integer of not smaller than 0; a, b, c and d satisfy $2 \leq a+b+c+d \leq 1{,}000$,

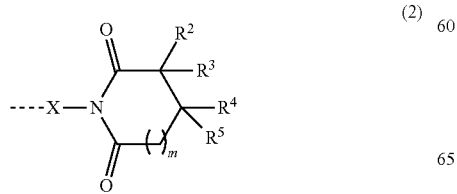

(2)

-continued

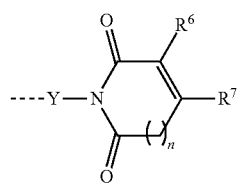

(3)

wherein each of $R^2$ to $R^7$ independently represents a hydrogen atom or a substituted or unsubstituted monovalent hydrocarbon group having 1 to 10 carbon atoms; $R^3$ and $R^4$ may bond together to form a ring; $R^6$ and $R^7$ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to silicon atoms in the formula (1);

(A-2) a cyclic imide group-containing organopolysiloxane represented by the following average composition formula (1')

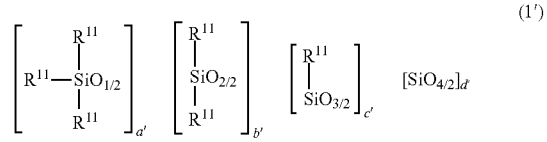

(1')

wherein $R^{11}$ independently represents a substituted or unsubstituted monovalent hydrocarbon group having 1 to 10 carbon atoms, or a group represented by the following general formula (2), (3) or (4); at least two $R^{11}$ groups bond together to form a structure represented by the following general formula (4); a' represents an integer of not smaller than 2; b' represents an integer of not smaller than 0; c' represents an integer of not smaller than 0; d' represents an integer of not smaller than 0; a', b', c' and d' satisfy $2 \leq a'+b'+c'+d' \leq 1{,}000$,

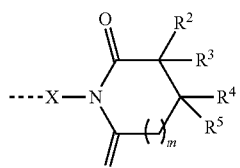
(2)

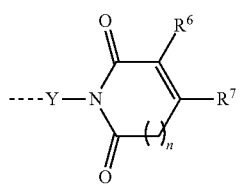
(3)

wherein each of R² to R⁷ independently represents a hydrogen atom or a substituted or unsubstituted monovalent hydrocarbon group having 1 to 10 carbon atoms; R³ and R⁴ may bond together to form a ring; R⁶ and R⁷ may bond together to form a ring; each of m and n represents an integer of 0 to 3; each of X and Y represents a substituted or unsubstituted divalent hydrocarbon group that has 1 to 10 carbon atoms, and may have a hetero atom(s); broken lines represent connections to the silicon atoms in the formula (1'),

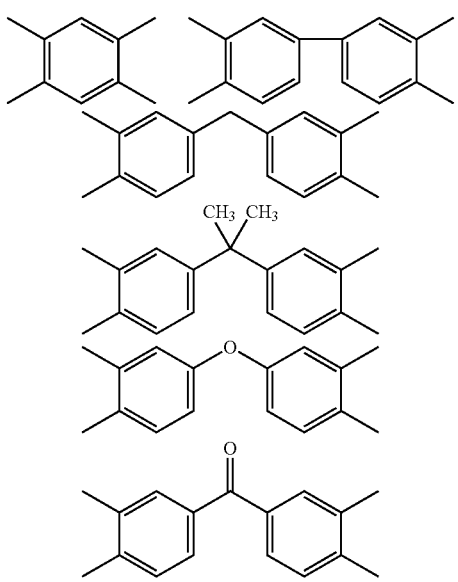
(4)

wherein Z represents a substituted or unsubstituted divalent hydrocarbon group that has 1 to 10 carbon atoms, and may have a hetero group(s); and wherein A in the general formula (4) of the component (A2) has any one of the following structures

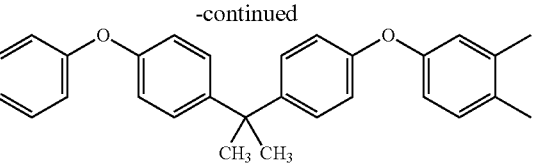
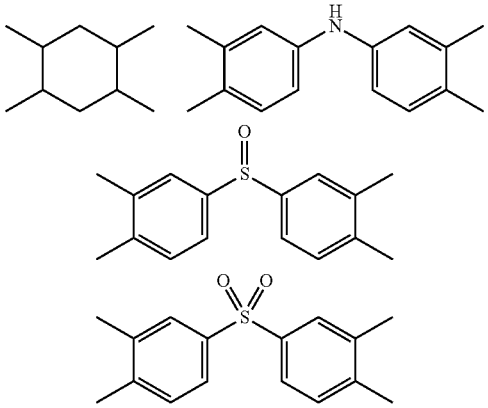

wherein bonds in the above structural formulae that are yet unbonded to substituent groups are to be bonded to carbonyl carbons forming cyclic imide structures in the general formula (4).

2. The heat-curable resin composition according to claim 1, wherein at least one of R's and/or R¹¹s is an organic group having a maleimide structure represented by the following formula (3')

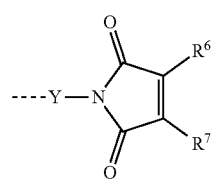
(3')

wherein each of R⁶ and R⁷ represents a hydrogen atom or a substituted or unsubstituted monovalent hydrocarbon group having 1 to 10 carbon atoms; R⁶ and R⁷ may bond together to form a ring; Y represents a substituted or unsubstituted divalent hydrocarbon group that has 1 to 10 carbon atoms, and may have a hetero atom(s); a broken line represents a connection to the silicon atoms in the formula (1) or (1').

3. A semiconductor device encapsulated by a cured product of the heat-curable resin composition according to claim 1.

4. The heat-curable resin composition according to claim 1, wherein the component (A) comprises both (A-1) and (A-2).

5. The heat-curable resin composition according to claim 1, wherein the component (A) comprises only (A-2).

6. The heat-curable resin composition according to claim 1, wherein the cyclic imide group-containing organopolysiloxane (A-1) is a component represented by:

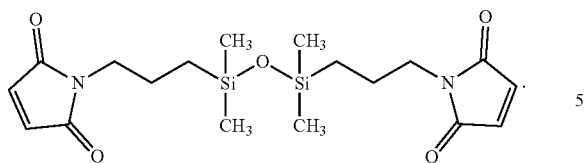
7. The heat-curable resin composition according to claim 1, wherein the cyclic imide group-containing organopolysiloxane (A-2) is a component represented by:
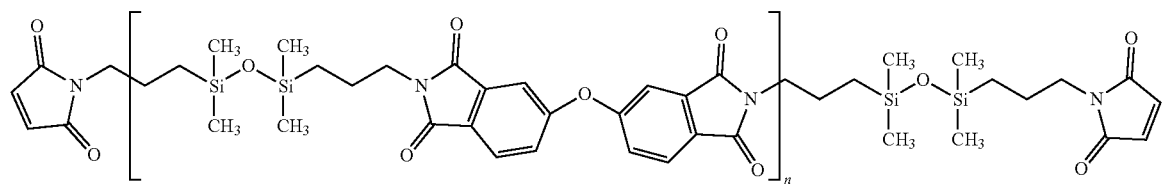
wherein n=3.
* * * * *